United States Patent [19]

Murata et al.

[11] Patent Number: 5,229,547
[45] Date of Patent: Jul. 20, 1993

[54] ELECTRONIC CIRCUIT ELEMENTS AND A METHOD OF MANUFACTURING THE SAME

[75] Inventors: Norikazu Murata, Otsu; Aisaku Nagai, Iwaki, both of Japan

[73] Assignee: Kureha Kagaku Kogyo Kabushiki Kaisha, Tokyo, Japan

[21] Appl. No.: 751,971

[22] Filed: Aug. 29, 1991

[30] Foreign Application Priority Data

Sep. 5, 1990 [JP] Japan .................................. 2-235327

[51] Int. Cl.⁵ .............................................. H05K 1/00
[52] U.S. Cl. .................................. 174/261; 174/255; 250/338.3; 250/349
[58] Field of Search ............... 174/255, 268, 252; 361/386, 388; 250/338.3, 349

[56] References Cited

U.S. PATENT DOCUMENTS 4,556,796 12/1985 Renals ............................... 250/338
4,983,838 1/1991 Nagai et al. ....................... 250/338

FOREIGN PATENT DOCUMENTS 0131996 6/1985 European Pat. Off. .
0338711 1/1989 European Pat. Off. .
58-32337 8/1983 Japan .
61-175583 2/1989 Japan .

*Primary Examiner*—Lincoln Donovan
*Assistant Examiner*—Cheryl R. Figlin
*Attorney, Agent, or Firm*—Nixon & Vanderhye

[57] ABSTRACT

An electronic circuit element comprising a substrate having a predetermined electric characteristic and a pair of opposing surfaces. At least one first electrode is provided on one of the surfaces of the substrate while a second electrode is provided on the other of the surfaces of the substrate so as to oppose the at least one first electrode. A lead electrode is provided on the other surface of the substrate so as to extend from an edge of the second electrode. A compensating electrode is provided to at least one of the first and second electrodes on the substrate for compensating for a difference in the overlapping area between the first electrode and the second electrode inclusive of the lead electrode, due to a deviation in a disposition of the second electrode on the basis of the first electrode.

49 Claims, 3 Drawing Sheets

ELECTRONIC CIRCUIT ELEMENTS AND A METHOD OF MANUFACTURING THE SAME

BACKGROUND OF THE INVENTION

The present invention relates to electronic circuit elements having a pair of opposing electrodes such as pyroelectric elements, capacitative elements or piezoelectric elements and methods of manufacturing the same.

For example, a pyroelectric element as a electronic circuit element with opposing electrodes on each of both the surfaces of a pyroelectric substrate having predetermined electric characteristics is known. Generally, such a pyroelectric element has lead electrodes extending from the corresponding electrodes for connection to succeeding electronic circuits, as disclosed in Japanese Utility Model Application Laying Open No. Sho 58-32337.

When such a pyroelectric element is used as an infrared detector for detection of invaders, it includes a pair of pyroelectronic elements connected in series or in parallel with each other in reverse relationship in polarity (hereinafter referred to as reverse-series and reverse-parallel, respectively) so as not to respond to so-called same phase noise such as changes in room temperature or incident disturbant light, as disclosed in Japanese Patent Application Laying Open No. Sho 61-175583.

In an electronic circuit element which has opposing electrodes, that is, one on one surface of a substrate and the other on the other surface of the substrate, and lead electrodes provided on the substrate and extending from the corresponding opposing electrodes, the overlapping of the opposing electrodes and the corresponding lead electrodes which is one of the most important factors defining the element is required to be in a predetermined relationship. Otherwise, a desired given electric characteristic of the element cannot be obtained. If the overlapping varies from one manufacturing lot to another, the resulting electric characteristic of the product also varies, so that various adjustments are required when the electronic circuit element is assembled in the circuit concerned.

If, for example, a pair of pyroelectric elements is connected with each other in reverse-series or reverse-parallel relationship so as to cancel said same phase noise by outputting reverse and same phase output, the light receiving areas of both the pyroelectric elements or the area where the opposing electrodes are overlapped each other must be the same, inclusive of the corresponding lead electrodes. However, a pair of pyroelectric elements having such same area is difficult to produce.

As disclosed earlier in U.S. Pat. No. 4,983,838, the applicant made a proposal as a solution to said equality in the light receiving area in which the lead electrodes extend in the same direction in both the pyroelectric elements, such that even if the electrode pattern formation including the lead electrode on one surface of the pyroelectric substrate deviates from the other side electrode pattern, the light receiving areas of both the pyroelectric elements are the same.

However, in the element disclosed in U.S. Pat. No. 4,983,838, the lead electrodes must be extended around the opposing electrodes for wiring to thereby cause an increase in the required area of the pyroelectric member or substrate. This is one of the factors which hinder the miniaturization of pyroelectric elements or infrared detectors. Especially, when a polymer film is used as a pyroelectric substrate, a supporting base plate which is made of an alumina or plastic material is required to support the film around the periphery of the lead electrodes. Therefore, the miniaturization is further difficult as the lead electrodes are so extended around the electrode. Since the lead electrodes in the disclosed art are necessarily long, there is a high probability of disconnection at subsequent manufacturing steps. In addition, though the equality of the light receiving areas or sensitivities in a pair of pyroelectric elements can be minimized in one manufacturing lot, the sensitivity of the pyroelectric elements can still change from one manufacturing lot to another.

In a flared detector for detection of invaders and including such a pair of pyroelectric elements, the electrode dimensions are generally very small; about 1 mm wide and about 2 mm long. The distance between the opposing electrodes is between 0.8 mm and 1 mm in order to detect the move of an invader.

As be obvious from these values, generally, in a small-scaled electronic circuit element in which a pair of opposing electrodes and lead electrodes therefrom are formed on an dielectric member, a piezoelectric member, a semiconductor member or a resistant member, as well as such a pair of pyroelectric elements, the area where the opposing electrodes inclusive of the lead electrodes overlap each other or face each other with the substrate between must be considered. This is not a problem as to whether the sizes or size ratio of the electrodes and the lead electrodes is large or not, but the above disadvantages would generally occur.

SUMMARY OF THE INVENTION

The present invention is made in view of the above problems. It is an object of the present invention to provide an electronic circuit element which has a predetermined characteristics based on said overlapped area which does not change depending on manufacturing lot, as mentioned above, even if an opposing electrode, inclusive of the corresponding lead electrode, on one surface of a substrate having a predetermined electronic characteristic deviates in the electrode formation from an other opposing electrode, inclusive of the corresponding lead electrode on the other surface of the substrate, and a method of manufacturing such electronic circuit element.

It is another object of the present invention to provide an electronic circuit element which is miniaturized as expected and has a reduced probability of disconnection of the lead electrodes in manufacture and minimized variations in the characteristic which may occur in one lot and also from lot to lot, and a method of manufacturing such electronic circuit element.

The above objects of the present invention are achieved by an electronic circuit element comprising: a substrate having a predetermined electric characteristic, at least one first electrode provided on one of surfaces of the substrate, a second electrode provided on the other of the surfaces of the substrate so as to be opposed to the first electrode, a lead electrode provided on the other surface of the substrate and extending from an edge of the second electrode, a compensating electrode connected to at least one of the first and second electrodes and disposed on the substrate for compensating for a difference in the overlapping area between the first electrode and the second electrode, inclusive of the lead electrode, due to a deviation in a mutual disposition between the first and second electrodes.

According to the present invention, the above objects are also achieved by a method of making an electronic circuit element, which comprises steps of forming at least one first electrode on one surface of a substrate having a predetermined electric characteristic by means of a first electrode forming pattern, and forming a second electrode opposite to the first electrode and a lead electrode extending from one edge of the second electrode on the other surface of the substrate opposite to one surface thereof by means of a second electrode forming pattern, wherein the method includes steps of providing a pattern for a compensating electrode to at least one of the first and second electrode forming patterns, the compensating electrode compensating for a difference in the overlapping area between the first electrode and the second electrode, inclusive of the lead electrode, due to a deviation in a mutual disposition between the first and second electrodes, and forming the compensating electrode connected to at least one of the first and second electrodes and disposed on the substrate.

The compensating electrode according to the present invention compensates for the difference in the overlapping area between the first electrode and the opposing second electrode, inclusive of the lead electrode due to the deviation in the mutual disposition of the both electrodes, so that an electronic circuit element having the negligible overlapping difference and minimized unevenness in characteristic which would otherwise occur from one manufacturing lot to another is provided even if the first and second electrodes disposed by an electrode forming device are mutually deviated or shifted.

According to the present invention, an electronic circuit element is provided in which even if said deviation occurs, the overlapping area is always constant, so that an electronic circuit element where one or more pairs of elements is incorporated is provided without extending the lead electrodes around the electrode zone and with a miniaturized size as expected in which the lead electrodes are less likely to disconnect in manufacture.

The substrate having required electric characteristics in the present invention varies depending on the target electronic circuit element. For example, if the electronic circuit element is a resistant element such as a resistor or a capacitative element such as a capacitor, the substrate is made of a resistant member or a dielectric member. If the electronic circuit element is a pyroelectric element or a piezoelectric element, the substrate is made of a pyroelectric member or a piezoelectric member. If the electronic circuit element is a Hall element or a photon type photodetector, the substrate is made of a semiconductor. If the substrate is a macromolecular pyroelectric member, the substrate used is preferably a pyroelectric film composing of a vinylidene fluoride resin.

The electronic circuit element according to the present invention, especially a pyroelectric element or a photodetector to detect electromagnetic waves, is preferably so formed as to receive signals at the substrate surface where the lead electrode is provided. The substrate surface opposite to the signal receiving surface does not hinder the reception of signals, then it is possible to use the conventional wiring technique where a lead wire is directly connected to the electrode by solder. Preferably, the second lead electrode may be provided on the opposite substrate surface in order to miniaturize the element.

The substrate may be an inflexible or rigid plate or a flexible film such as a film applied to a flexible printed board or the like.

While, generally, the first and second electrodes formed on the surfaces of the substrate in the present invention preferably are rectangular, they are not limited to only such shape and may be triangular, square, circular, elliptical, trapezoidal or of any other form, of course. While the first electrode in the present invention may be the same in size and form as the second electrode, the former preferable is slightly larger or smaller than the latter in consideration of the accuracy with which the electrodes are formed by the electrode forming device. In other words, either one of the first and second electrodes is preferably formed larger or smaller than the other, in which case the degree of being larger or smaller is determined by the maximum deviation between the opposing electrodes formed by the electrode forming unit.

As for the compensating electrode in the present invention which compensates for a difference in the overlapping area between the opposing first and second electrodes, inclusive of the corresponding lead electrodes, due to the deviation of the opposite side disposition of the second electrode onto the first electrode, it is necessarily not required that the compensating electrode is formed on each of the first and second electrodes. It may be connected to any one of the edges of any one of the first and second electrodes. While it is preferably rectangular, it may be triangular or of any other form as required.

If one of the first and second electrodes is formed smaller than the other, the compensating electrode in the present invention is connected to only the smaller electrode in a preferred embodiment in which the degree of being smaller is determined by the maximum deviation of the opposite side disposition of the second electrode onto the first electrode. In an another preferred embodiment in which the compensating electrode is formed as a cutout or an imaginary compensating electrode, it is connected only to the larger electrode. In such an imaginary compensating electrode, the electrode itself has no protrusions, so that the electronic circuit element with the imaginary compensating electrode is preferable for miniaturization as the case may be.

In a further preferred embodiment in which the first and second electrodes have the same size and form, the compensating electrode is connected to each of the first and second electrodes. If either one of the first and second electrodes is formed smaller than the other and the degree of being smaller is within the maximum deviation of the opposite side disposition of the second electrode onto the first electrode, the compensating electrode is preferably connected to each of the first and second electrodes.

In a preferred embodiment which is preferable from a standpoint of miniaturization, the compensating electrode in the present invention is connected to one edge of the electrode opposite to the edge thereof from which the lead electrode extends.

While the compensating electrode in the present invention may take any form if the above requirements are satisfied, the compensating electrode preferably has the same width as the lead electrode and a length larger than a length corresponding to said maximum deviation. The number of compensation electrodes is not required to be one; for example, a plurality of compensating electrodes may be distributed along one edge of one electrode such that the sum of the respective widths of the compensating electrodes is equal to the width of the lead electrode.

One example of the electronic circuit element according to the present invention includes at least one pair composing of a first electrode and a second electrode opposed to the first electrode. Therefore, the present invention can include a plurality of pairs of such electrodes. In this case, the present invention is applicable to some or all of the pairs of electrodes. Similarly, another example of electronic circuit element according to the present invention includes at least one combination of an element (hereinafter referred to as a first basic element) including one of a pair of first electrodes, and one of a pair of second electrodes disposed opposed to the one of the first electrodes, and a lead electrode being connected to each of the one of the pair of first electrodes and the one of the pair of second electrodes, and an element (hereinafter referred to as a second basic element) including the other of the pair of first electrodes, the other of the pair of second electrodes disposed opposed to the other of the pair of first electrodes and a lead electrode connected to the other of the pair of first electrodes and the other of the pair of second electrodes. Thus, the present invention may include a plurality of such combinations. In this case, the present invention is applicable to all or some of such combinations.

Embodiments of the present invention where the first and second basic elements each are a pyroelectric element will be described in more detail with reference to the drawings in order to clarify the invention described above and other inventions.

It is to be noted that the present invention is not limited to these embodiments.

DETAILED DESCRIPTION OF THE PREFERRED EMBODIMENTS

- In the following embodiments, the first or second electrodes, lead electrodes and compensating electrodes, shown by solid lines, are provided on one surface of a pyroelectric substrate while the first or second electrodes, lead electrodes and compensating electrodes, shown by broken lines, are provided on the other surface of the substrate. The substrate is omitted in other figures than FIG. 1.

Figure 1:
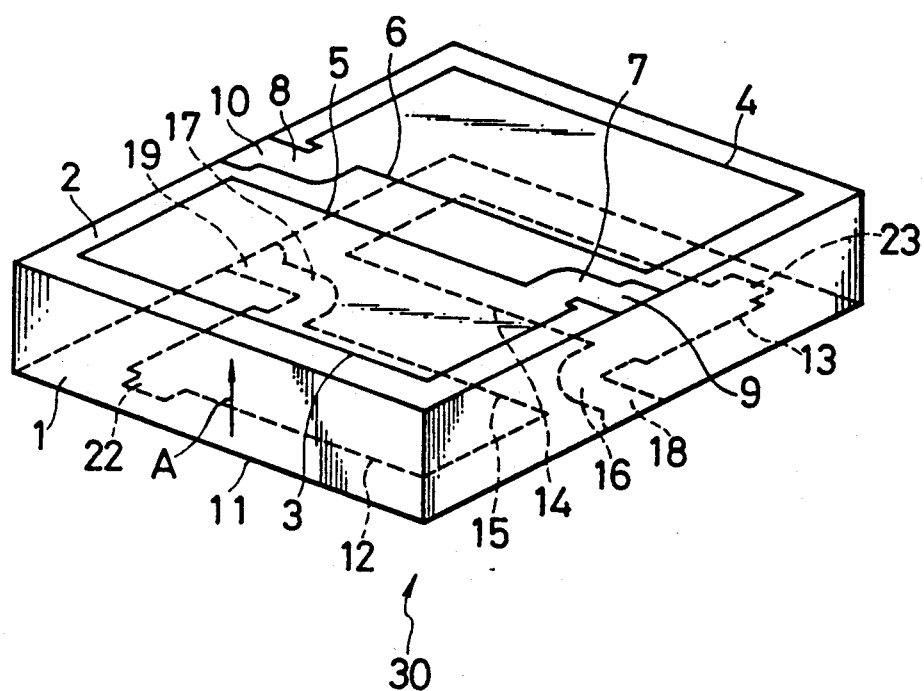
FIG. 1 is a perspective view of a preferred embodiment of the present invention.
Figures 2, 3:
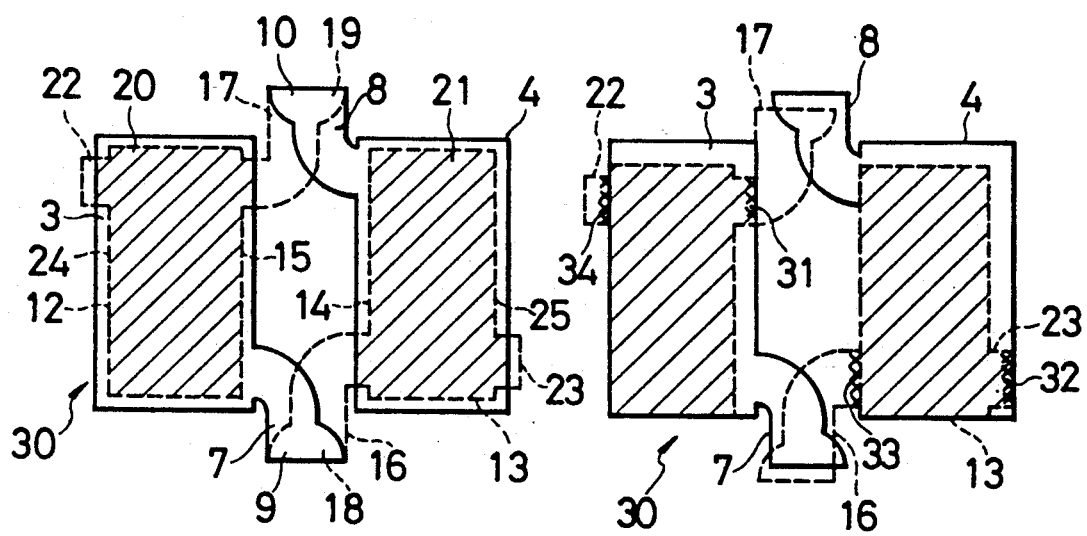
FIG. 2 is a plan view of the embodiment of FIG. 1.
FIG. 3 is a plan view of the embodiment of FIG. 1, illustrating its operation.

In FIGS. 1 and 2, the pyroelectric substrate 1 is a film-like substrate having predetermined electric characteristics in which self-polarization occurs due to thermal change in the direction of A. The substrate 1 has on one surface 2 thereof a pair of first rectangular electrodes 3 and 4 and a pair of first lead electrodes 7 and 8 extending from opposing edges 5 and 6 of the electrodes 3 and 4 in opposite directions, respectively. The lead electrodes 7 and 8 have wider ends 9 and 10 to allow easy and reliable connection of subsequent-stage electronic circuits such as a field effect transistor (FET) to those ends. Provided on the opposite surface 11 of the substrate 1 to the surface 2 is a pair of second rectangular electrodes 12 and 13 opposed to the electrodes 3 and 4, respectively. In the present embodiment, the electrodes 12 and 13 are formed narrower than the electrodes 3 and 4 by the above-mentioned maximum width in consideration of uneven electrode forming by an electrode forming device (not shown). A pair of second lead electrodes 16 and 17 extend on the surface 11 from edges 14 and 15 of the electrodes 13 and 12 in opposite directions. The lead electrodes 16 and 17 have wider ends 18 and 19 for reasons similar to those described with reference to the ends 9 and 10.

The lead electrodes are disposed such that ends 18 and 19 overlap the corresponding ends 9 and 10. Lead wires are connected at the overlapping portions by connection means disclosed in Japanese Patent Application Laying Open No. Sho 61-175583 and Japanese Utility Model Application Laying Open No. Sho 58-32337. Thus, in the present embodiment, a pyroelectric element as the first basic element which comprises the electrodes 3 and 12 and another pyroelectric element as the second basic element which comprises the electrodes 4 and 13 are connected in reverse-parallel relationship.

In the present embodiment, compensating electrodes 22 and 23 which compensate for the difference between the area (shown hatched) 20 where the electrode 3 and the opposite electrode 12 and the lead electrode 17 extending from the electrode 12 overlap and the area (shown hatched) 21 where the electrode 4 and the opposite electrode 13 and the lead electrode 16 extending from the electrode 13 overlap due to the deviation in the disposition of the electrodes 3 and 4 on the basis of the electrodes 12 and 13 are provided on the surface 11 so as to connect with and extend from edges 24 and 25 of the electrodes 12 and 13 which are opposite to the edges 15 and 14 of the smaller electrodes 12 and 13 from which the lead electrodes 17 and 16 extend. The compensating electrodes 22 and 23 are formed so as to be of the same width as the lead electrodes 16 and 17 in the present embodiment.

The electronic circuit element 30 having the above mentioned structure is preferably applicable, for example, to infrared detectors for detection of invaders. Even if the electrodes 12 and 13 and lead electrodes 16 and 17 are deviated from their proper or normal positions shown in FIG. 2 to relative positions to the electrodes 3 and 4 and the lead electrodes 7 and 8 as shown in FIG. 3 due to causes of the electrode forming device (not shown), an increase (cross-hatched) 31 in the overlapping area of the lead electrode 17 in the first basic element of the electronic circuit element 30 is compensated by an increase (cross-hatched) 32 in the overlapping area of the compensating electrode 23 in the second basic element. In addition, a decrease (cross-hatched) 33 in the overlapping area of the lead electrode 16 of the second basic element is compensated by a decrease (cross-hatched) 34 in the overlapping area of the compensating electrode 22 of the first basic element. As a result, there is no difference in overlapping area between the first and second basic elements. Thus, an electronic circuit element, for example, an infrared detector for detection of invaders comprising a pair of pyroelectric elements with uniform characteristic and having no influence by the same phase noise at all times in a preferable manner, is provided.

While the overlapping areas between the ends 9 and 18 and between the ends 10 and 19 may change, these areas are short-circuited by the lead wires, so that the difference between the overlapping areas does not becomes a problem.

It can be considered in the present embodiment that the increase 31 in the area of the first basic element is compensated by an equivalent decrease 34 in the area of the first basic element and that the decrease 33 in the second basic element is compensated by an equivalent increase 32 in the area of the second basic element and, as a result, that the overlapping area of FIG. 2 in the respective basic elements is equal to the overlapping area of FIG. 3 in the respective basic elements. Therefore, by setting the degree of a scale-down of the electrodes 12 and 13 on the basis of electrodes 3 and 4 within the maximum deviations of the electrode formation by the electrode forming device, an electronic circuit element is obtained in which the overlapping areas are equal invariably even if the deviation between the electrodes change variously. Thus, even if the manufacturing lots differ from each other, electronic circuit elements which have the same characteristic are invariably obtained in a stabilized manner.

Figures 4, 5:
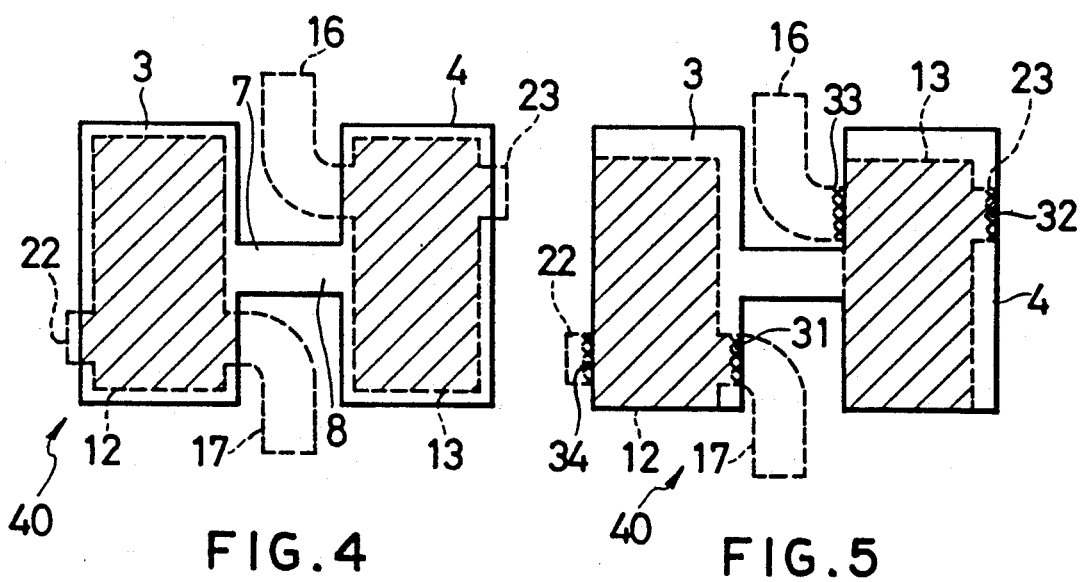
FIG. 4 is a plan view of another preferred embodiment of the present invention.
FIG. 5 is a plan view of the embodiment of FIG. 4, illustrating its operation.

Another embodiment of the present invention will be shown in FIG. 4. An electronic circuit element 40 of this embodiment includes a pair of pyroelectric elements connected in reverse-series relationship and differs from the previous embodiment in that straight lead electrodes 7 and 8 are directly joined to each other on a surface 2. Therefore, as shown in FIG. 5, the electronic circuit element 40 produces advantages similar to those produced by the electronic circuit element 30.

Figures 6, 7:
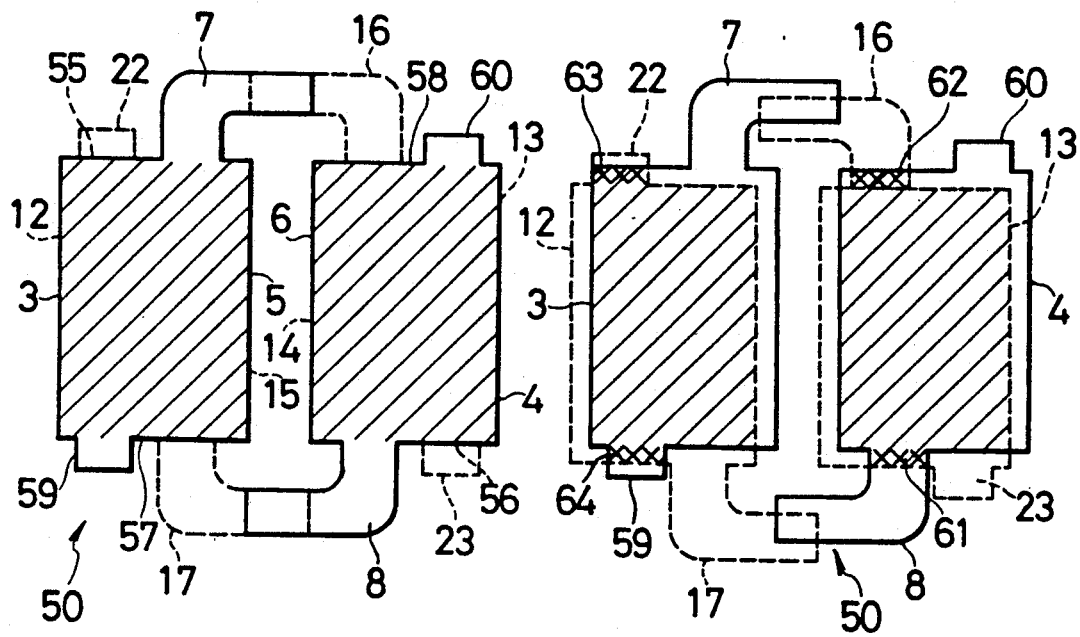
FIG. 6 is a plan view of a third preferred embodiment of the present invention.
FIG. 7 is a plan view of the embodiment of FIG. 6, illustrating its operation.

A further embodiment of the present invention is shown in FIG. 6. An electronic circuit element 50 of this embodiment includes a pair of pyroelectric elements connected in reverse-parallel relationship as in the elements 30. In this device, electrodes 3, 4, 12 and 13 all have the same size and shape and compensating electrodes 59, 60, 22 and 23 are provided to edges 57, 58, 55 and 56 of the electrodes 3, 4, 12 and 13 opposite to the lead electrodes 7, 8, 17 and 16, respectively.

Even if the electrodes 12 and 13 are deviated from fitting positions in FIG. 6 to shifted positions as shown in FIG. 7, in the electronic circuit element 50 of the present embodiment, increases 61 and 62 in the overlapping areas of the lead electrodes 8 and 16 in the second basic element are compensated by increases 64 and 63 in the overlapping areas of the compensating electrodes 59 and 22 in the first basic element to thereby produce advantages similar to those mentioned in the previous embodiments.

The compensating electrodes of the present electronic circuit element 50 have the same width as the lead electrodes. According to this embodiment, the value of the overlapping areas varies depending on the presence/absence of the deviation, so that the characteristics of electronic circuit elements can vary from one manufacturing lot to another.

Figure 8:
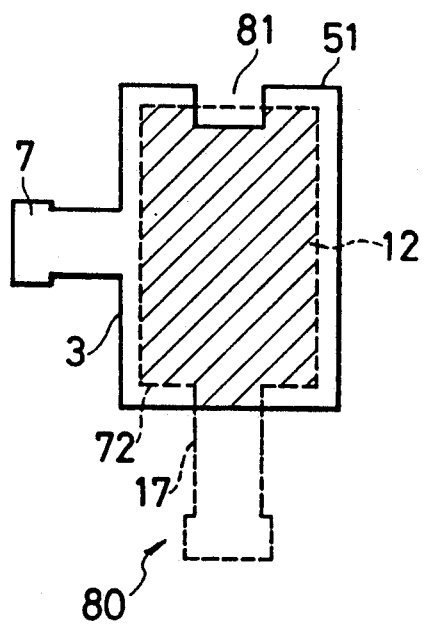
FIG. 8 is a plan view of a fourth preferred embodiment of the present invention.

While the above concerns the examples of the electronic circuit elements each comprising a pair of pyroelectric elements, the electronic circuit element according to the present invention may be embodied including a single pyroelectric element, as shown in FIG. 8. In FIG. 8, the electronic circuit element 80 includes a first electrode 3 provided on one surface 2 of the substrate 1 and a second electrode 12 opposing to the electrode 3 provided on the other surface 11 of the substrate 1. A lead electrode 17 extending from an edge 72 of the electrode 12 is provided on the other surface 11 of substrate 1. A compensating electrode 81 which compensates for the difference in overlapping area between the electrode 3 and the electrode 12 with lead electrode 17 due to the deviation in the disposition of the electrode 12 on the basis of the electrode 3 is provided on the substrate 1 and connected to an edge 51 of electrode 3. The compensating electrode 81 of the present embodiment is realized by means of a rectangular cutout in the electrode 3 as an imaginary compensating electrode.

Figure 9:
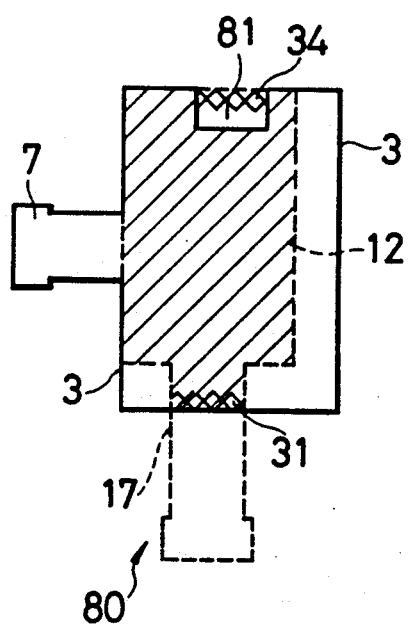
FIG. 9 is a plan view of the embodiment of FIG. 8, illustrating its operation.

As be clear from the electronic circuit element 80 of FIG. 9, and increase 31 in the overlapping area between the lead electrode 17 and the electrode 3 is compensated by an increase 34 in the overlapping area between the compensating electrode 81 and the electrode 12 (a decrease in terms of the relationship between the electrodes 3 and 12). As a result, the overlapping areas of FIGS. 8 and 9 are equal to each other, so that by setting the degree of a scale-down of electrode 12 on the basis of electrode 3 within the maximum deviation between the electrode formed by the electrode forming device, an electronic circuit element including a single element in which a constancy of the overlapping areas is secured can be provided even if a relatively position of one electrode to the other electrode may be changed variously. Thus, electronic circuit elements having the same characteristic are provided in a stabilized manner even if the manufacturing lots vary from one to another.

As be clear from the above description, the compensating electrode in the present invention is not necessarily required to be provided in each of the first and second electrodes and may be provided to any one of the first and second electrodes on the substrate.

As the electronic circuit element constituted by the above mentioned single element can be regarded as a single basic element in elements 30 and 40, unevenness in the characteristic thereof depending on manufacturing lot is eliminated.

Next, a method of manufacturing the electronic circuit element 30 according to the present invention will be described as an example.

In the method according to the present invention, a first mask with a fist electrode forming pattern involving the electrodes 3 and 4 and the lead electrodes 7 and 8 extending from the edges 5 and 6 of the electrodes 3 and 4, and a second mask with a second electrode forming pattern involving the electrodes 12 and 13, the lead electrodes 17 and 16 extending from the edges 15 and 14 of the electrodes 12 and 13 and the compensating electrodes 22 and 23 are firstly prepared. The electrodes 3 and 4 and the lead electrodes 7 and 8 are then formed on one surface 2 of the pyroelectric substrate 1 in conformity to the first electrode forming pattern by the electrode forming device. Thereafter, the electrodes 12 and 13, the lead electrodes 16 and 17 and the compensating electrodes 22 and 23 connected to the electrodes 12 and 13 are formed on the other surface 11 of the pyroelectric substrate 1 in conformity to the second electrode pattern by the electrode forming device. Thus, the electronic circuit element 30 having the characteristic mentioned above is obtained. The preferable electrode forming device used may be a sputtering device, a vapor deposition device or a screen printing device.

A method of manufacturing an another electronic circuit element 40, 50 or 80 will be obvious from the foregoing.

As described above, the essential of the present invention is that the compensating electrodes cancel the differences of the overlapping area due to the lead electrode based on a deviation due to the electrode pattern formation, so that the present invention is applicable so long as a lead electrode is provided to any one of the first and second electrodes.

What is claimed is:

1. An electronic circuit element comprising:
   a substrate having a predetermined electric characteristic;
   a first electrode provided on one surface of the substrate;
   a second electrode, smaller than the first electrode, provided on the other surface of the substrate and opposing the first electrode;
   a first lead electrode provided on the other surface of the substrate and connected to and extending outwardly from one edge of the second electrode;
   a compensating electrode provided on the other surface of the substrate and connected to and extending outwardly from another edge of the second electrode opposing the one edge for compensating for a difference between a standard overlapping area in which the first electrode and the second electrode inclusive of the first lead electrode overlap in a standard disposition and a deviated overlapping area in which the first electrode and the second electrode inclusive of the first lead electrode overlap in a disposition different from the standard disposition, wherein the deviated overlapping area is substantially the same as the standard overlapping area.

2. An electronic circuit element according to claim 1, wherein the basic element further comprises:
   a second lead electrode extending from one edge of the first electrode and disposed on the one surface of the substrate.

3. An electronic circuit element according to claim 1, wherein the compensating electrode has the same width as the first lead electrode.

4. An electronic circuit element according to claim 3, wherein the compensating electrode is a tab that protrudes from the second electrode.

5. An electronic circuit element according to claim 1, wherein the substrate is a dielectric member.

6. An electronic circuit element according to claim 5, wherein the compensating electrode has the same width as the first lead electrode.

7. An electronic circuit element according to claim 6, wherein the compensating electrode is a tab that protrudes from the second electrode.

8. An electronic circuit element according to claim 1, wherein the substrate is a pyroelectric member.

9. An electronic circuit element according to claim 8, wherein the compensating electrode has the same width as the first lead electrode.

10. An electronic circuit element according to claim 9, wherein the compensating electrode is a tab that protrudes from the second electrode.

11. An electronic circuit element according to claim 1, wherein the substrate is a piezoelectric member.

12. An electronic circuit element according to claim 11, wherein the compensating electrode has the same width as the first lead electrode.

13. An electronic circuit element according to claim 12, wherein the compensating electrode is a tab that protrudes from the second electrode.

14. An electronic circuit element according to claim 1, wherein the substrate is a semiconductor member.

15. An electronic circuit element according to claim 14, wherein the compensating electrode has the same width as the first lead electrode.

16. An electronic circuit element according to claim 15, wherein the compensating electrode is a tab that protrudes from the second electrode.

17. An electronic circuit element according to claim 1, further comprising:
   a second lead electrode provided on the one surface of the substrate and connected to and extending outwardly from one edge of the first electrode, each lead electrode having a main portion and an end portion, wherein the end portions of the first and second lead electrodes are wider than the main portions of the lead electrodes.

18. An electronic circuit element comprising:
   a substrate having a predetermined electric characteristic;
   a first electrode provided on one surface of the substrate;
   a second electrode, smaller than the first electrode, provided on the other surface of the substrate and opposing the first electrode;
   a first lead electrode provided on the other surface of the substrate and connected to and extending outwardly from one edge of the second electrode;
   a compensating notch formed in one edge of the first electrode for compensating for a difference between a standard overlapping area in which the first electrode and the second electrode inclusive of the first lead electrode overlap in a standard disposition and a deviated overlapping area in which the first electrode and the second electrode inclusive of the first lead electrode overlap in a nonstandard disposition wherein the deviated overlapping area is substantially the same as the standard overlapping area.

19. An electronic circuit element according to claim 18, further comprising:
   a second lead electrode extending from another edge of the first electrode and disposed on the one surface of the substrate.

20. An electronic circuit element according to claim 18, wherein the compensating notch has the same width as the first lead electrode.

21. An electronic circuit element according to claim 18, wherein the compensating notch is rectangular.

22. An electronic circuit element according to claim 18, wherein the substrate is a dielectric member.

23. An electronic circuit element according to claim 22, wherein the compensating notch has the same width as the first lead electrode.

24. An electronic circuit element according to claim 23, wherein the compensating notch is rectangular.

25. An electronic circuit element according to claim 18, wherein the substrate is a pyroelectric member.

26. An electronic circuit element according to claim 25, wherein the compensating notch has the same width as the first lead electrode.

27. An electronic circuit element according to claim 26, wherein the compensating notch is rectangular.

28. An electronic circuit element according to claim 18, wherein the substrate is a piezoelectric member.

29. An electronic circuit element according to claim 28, wherein the compensating notch has the same width as the first lead electrode.

30. An electronic circuit element according to claim 29, wherein the compensating notch is rectangular.

31. An electronic circuit element according to claim 18, wherein the substrate is a semiconductor member.

32. An electronic circuit element according to claim 31, wherein the compensating notch has the same width as the first lead electrode.

33. An electronic circuit element according to claim 32, wherein the compensating notch is rectangular.

34. An electronic circuit element comprising:
a substrate having a predetermined electric characteristic;
a first electrode means provided on one surface of the substrate and including first and second sub-electrodes;
a second electrode means provided on the other surface of the substrate opposing the first electrode means, the second electrode means including first and second sub-electrodes opposing and having the same size and shape as the first and second sub-electrodes of the first electrode means, respectively;
first and second lead electrodes provided on the other surface of the substrate and connected to and extending outwardly from first edges of the first and second sub-electrodes of the second electrode means, respectively;
compensating electrode means for compensating for a difference between (1) a first overlapping area in which the respective first sub-electrodes of the first and second electrode means inclusive of the first lead electrode overlap and (2) a second overlapping area in which the respective second sub-electrodes of the first and second electrode means inclusive of the second lead electrode overlap, caused by an offset from a standard disposition of the second electrode means with respect to the first electrode means, wherein the first overlapping area is substantially the same as the second overlapping area.

35. An electronic circuit element according to claim 34, wherein the compensating electrode means includes a first compensating electrode for the first lead electrode and a second compensating electrode for the second lead electrode;
the first compensating electrode being disposed on a surface of the substrate and connected to and extending outwardly from a corresponding one of a first edge of the second sub-electrode of the first electrode means and a second edge of the second sub-electrode of the second electrode means, the second edge of the second sub-electrode of the second electrode means opposing the first edge of the second sub-electrode of the second electrode means, the first edge of the second sub-electrode of the first electrode means corresponding to the first edge of the second sub-electrode of the second electrode means;
the second compensating electrode being disposed on a surface of the substrate and connected to and extending outwardly from a corresponding one of a first edge of the first sub-electrode of the first electrode means and a second edge of the first sub-electrode of the second electrode means, the second edged of the first sub-electrode of the second electrode means opposing the first edge of the first sub-electrode of the second electrode means, the first edge of the first sub-electrode of the first electrode means corresponding to the first edge of the first sub-electrode of the second electrode means.

36. An electronic circuit element according to claim 34, further comprising:
third and fourth lead electrodes disposed on the one surface of the substrate and connected to and extending outwardly from the first and second sub-electrodes of the first electrode means, respectively.

37. An electronic circuit element according to claim 35, wherein the first and second compensating electrodes have the same width as the first and second lead electrodes, respectively.

38. An electronic circuit element according to claim 37, wherein the first and second compensating electrodes are rectangular or square tabs.

39. An electronic circuit element according to claim 34, wherein the substrate is a dielectric member.

40. An electronic circuit element according to claim 34, wherein the substrate is a pyroelectric member.

41. An electronic circuit element according to claim 34, wherein the substrate is a piezoelectric member.

42. An electronic circuit element according to claim 34, wherein the substrate is made of a semiconductor member.

43. An electronic circuit element according to any one of claims 39 to 42, further comprising:
third and fourth lead electrodes disposed on the one surface of the substrate and connected to and extending outwardly from the first and second sub-electrodes of the first electrode means, respectively.

44. An electronic circuit element according to claim 35, wherein the substrate is a dielectric member.

45. An electronic circuit element according to claim 35, wherein the substrate is a pyroelectric member.

46. An electronic circuit element according to claim 35, wherein the substrate is a piezoelectric member.

47. An electronic circuit element according to claim 35, wherein the substrate is a semiconductor member.

48. An electronic circuit element according to any one of claim 44 to 47, wherein the first and second compensating electrodes have the same width as the first and second lead electrodes, respectively.

49. An electronic circuit element according to claim 48, further comprising:
third and fourth lead electrodes disposed on the one surface of the substrate and connected to and extending outwardly from the first and second sub-electrodes of the first electrode means, respectively.

* * * * *